United States Patent
Eguchi et al.

(10) Patent No.: US 9,549,485 B2
(45) Date of Patent: Jan. 17, 2017

(54) FRAME, AND ELECTRONIC APPARATUS

(71) Applicant: FUJI XEROX CO., LTD., Tokyo (JP)

(72) Inventors: Hirotake Eguchi, Kanagawa (JP); Akira Harada, Kanagawa (JP); Shohei Matsunami, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 143 days.

(21) Appl. No.: 13/888,848

(22) Filed: May 7, 2013

(65) Prior Publication Data

US 2014/0160713 A1    Jun. 12, 2014

(30) Foreign Application Priority Data

Dec. 11, 2012  (JP) ................................ 2012-270328

(51) Int. Cl.
  *B62B 3/00*   (2006.01)
  *H05K 7/14*   (2006.01)
  *G03G 21/16*  (2006.01)

(52) U.S. Cl.
  CPC ........ *H05K 7/1488* (2013.01); *G03G 21/1619* (2013.01)

(58) Field of Classification Search
  USPC ............................................. 280/79.11, 79.3
  See application file for complete search history.

(56) References Cited

U.S. PATENT DOCUMENTS

| | | | | |
|---|---|---|---|---|
| 2,782,045 | A | * | 2/1957 | Hulbert ........................ 280/32.6 |
| 3,891,228 | A | * | 6/1975 | Rhinehart et al. ............ 280/639 |
| 4,332,052 | A | * | 6/1982 | Remington ........................ 16/30 |
| 4,641,845 | A | * | 2/1987 | Hewitt ........................ 280/79.11 |
| 5,428,866 | A | * | 7/1995 | Aschow ............................ 16/30 |
| 2003/0127815 | A1 | * | 7/2003 | Hall .................... B60B 33/0002 280/79.3 |

FOREIGN PATENT DOCUMENTS

| | | |
|---|---|---|
| JP | H10-5046 A   | 1/1998 |
| JP | A-10-232525  | 9/1998 |
| JP | A-2000-269669 | 9/2000 |
| JP | A-2002-040736 | 2/2002 |

OTHER PUBLICATIONS

Feb. 2, 2016 Office Action issued in Japanese Patent Application No. 2012-270328.

* cited by examiner

*Primary Examiner* — Erez Gurari
(74) *Attorney, Agent, or Firm* — Oliff PLC

(57) ABSTRACT

A frame includes a base frame that is formed of a framework formed in a substantially rectangular shape by square pipes and is provided with plural cutout portions on the lower surface sides of the square pipes that are long sides of the framework, a bracket that includes a plate section on which a caster is mounted, and in which a portion of the plate section is fitted into the cutout portion, and the caster that is mounted on the plate section and located further to the inside than an outer periphery of the framework when the base frame is viewed from the upper surface side.

4 Claims, 24 Drawing Sheets

FRAME, AND ELECTRONIC APPARATUS

CROSS-REFERENCE TO RELATED APPLICATIONS

This application is based on and claims priority under 35 USC 119 from Japanese Patent Application No. 2012-270328 filed Dec. 11, 2012.

BACKGROUND

Technical Field

The present invention relates to a frame, and an electronic apparatus.

SUMMARY

According to an aspect of the invention, there is provided a frame including: a base frame that is formed of a framework formed in a substantially rectangular shape by square pipes and is provided with plural cutout portions on the lower surface sides of the square pipes that are long sides of the framework; a bracket that includes a plate section on which a caster is mounted, and in which a portion of the plate section is fitted into the cutout portion; and the caster that is mounted on the plate section and located further to the inside than an outer periphery of the framework when the base frame is viewed from the upper surface side.

BRIEF DESCRIPTION OF THE DRAWINGS

Exemplary embodiments of the present invention will be described in detail based on the following figures, wherein.

DETAILED DESCRIPTION

First Exemplary Embodiment

Figure 1:
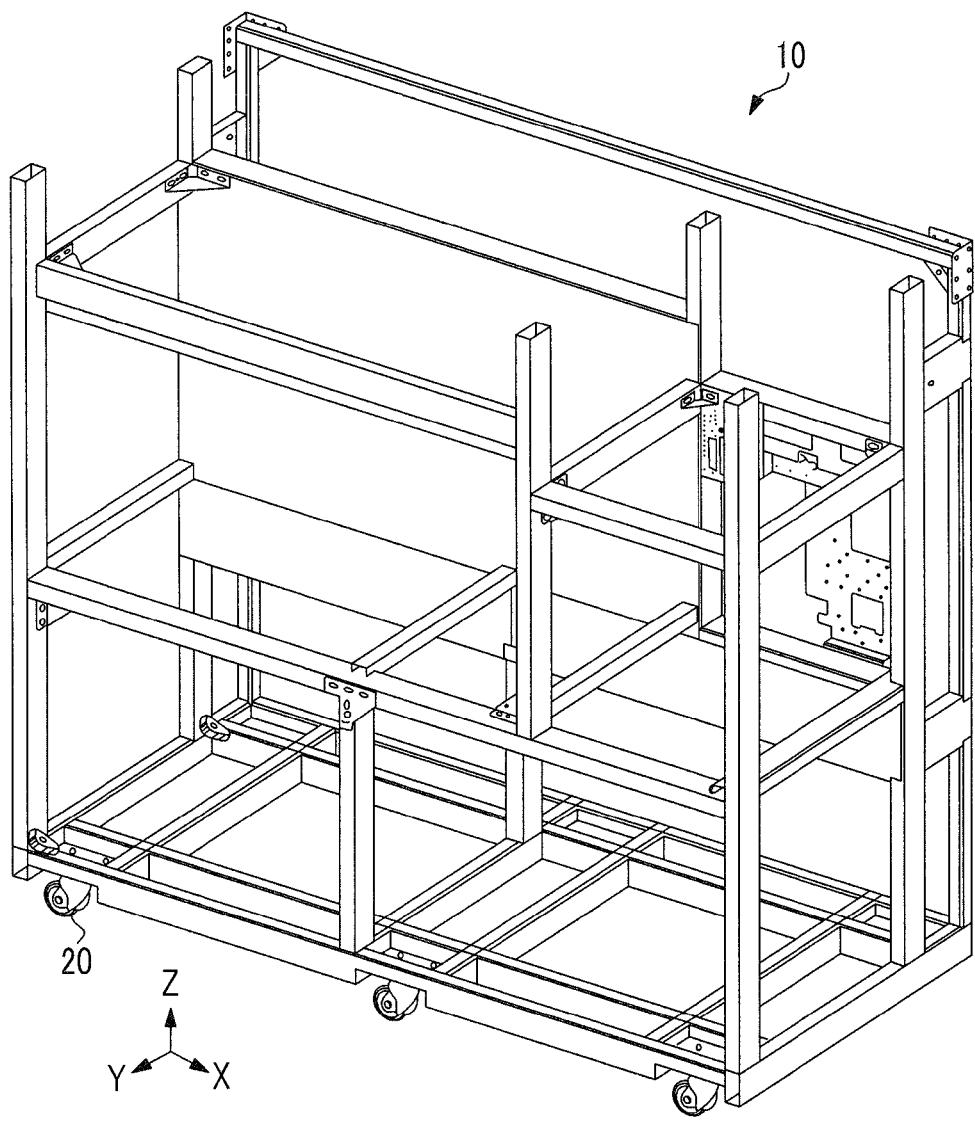
FIG. 1 is an external appearance diagram of a frame according to an exemplary embodiment of the invention.

FIG. 1 is an external appearance diagram of a frame 10 with which an image forming apparatus (an example of an electronic apparatus) according to an exemplary embodiment of the invention is provided. The frame 10 is a structure in which plural square pipes are welded and combined. The frame 10 supports devices or components which configure the image forming apparatus. In addition, in FIG. 1, the rectangular coordinates of a three-dimensional space are shown by an X axis, a Y axis, and a Z axis which are perpendicular to each other, and a vertical direction is set to be the Z axis, a direction along a long side of the frame 10 as viewed from the vertical direction is set to be the X axis, and a direction along a short side of the frame 10 as viewed from the vertical direction is set to be the Y axis. In the following description, for convenience of description, there is a case where the positive direction side of the Y axis is referred to as the front side, the negative direction side of the Y axis is referred to as the back side, the positive direction side of the Z axis is referred to as the upper surface side, and the negative direction side of the Z axis is referred to as the lower surface side.

Figure 2:
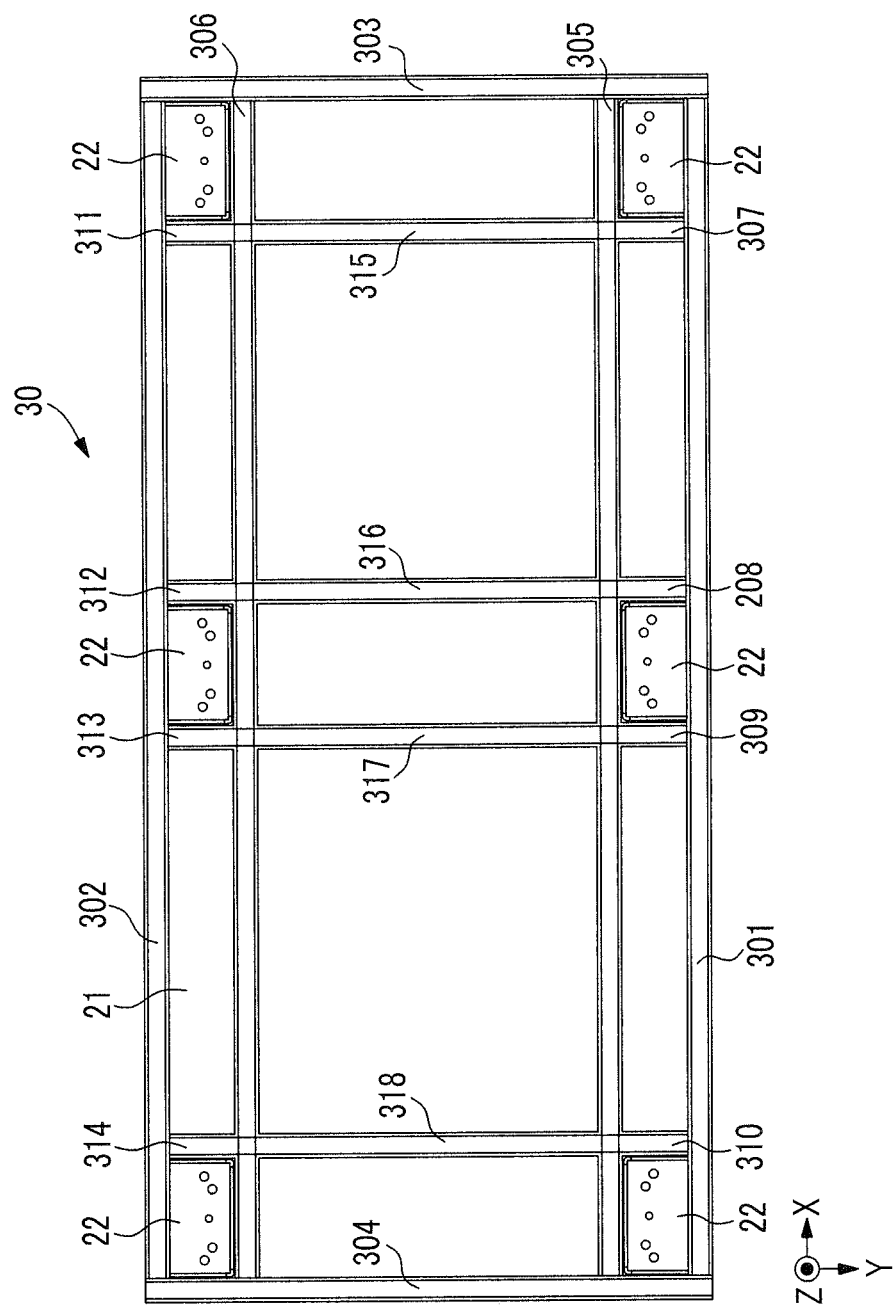
FIG. 2 is a diagram showing a base frame when viewed from the upper surface side.
Figure 3:
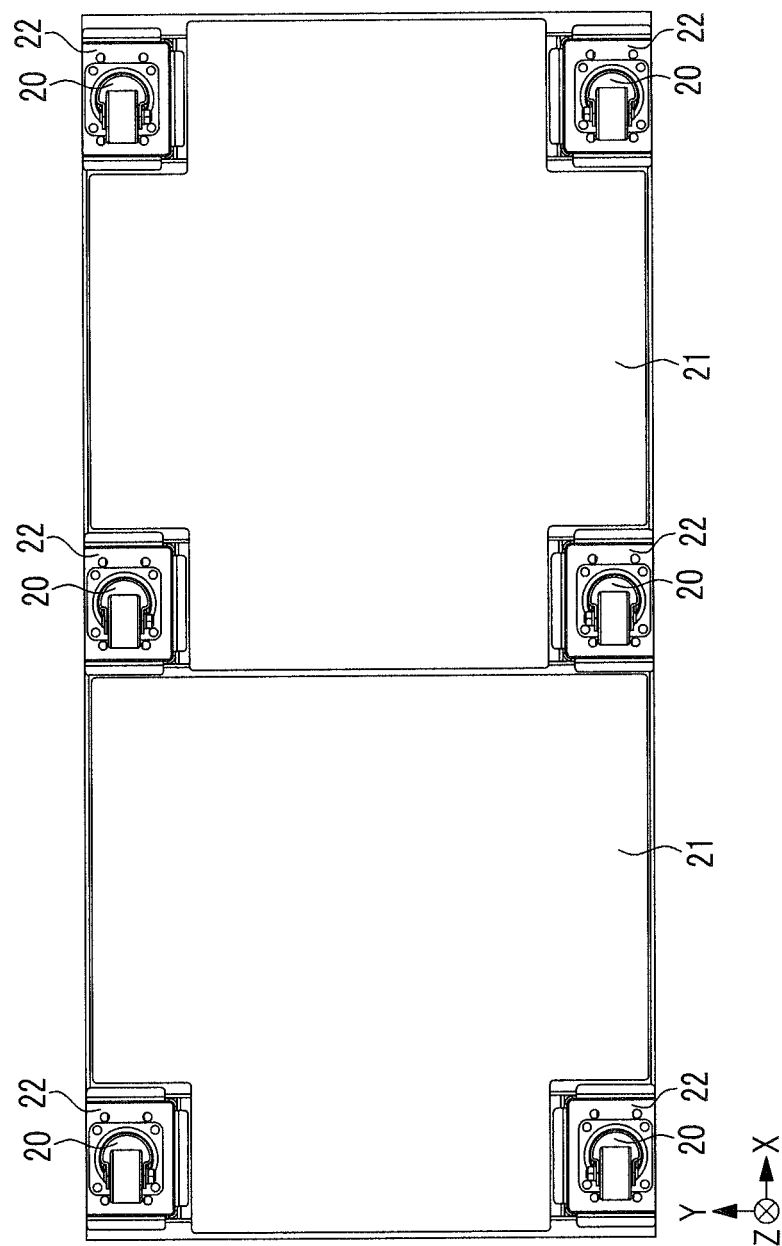
FIG. 3 is a diagram showing the frame when viewed from the lower surface side.

FIG. 2 is a diagram when a section which is a bottom in the frame 10 is viewed from the upper surface side, and FIG. 3 is a diagram when the section which is the bottom is viewed from the lower surface side. In addition, in FIG. 2, illustration of members which are located further to the upper surface side than the section which is the bottom is omitted. As shown in FIG. 2, the section which is the bottom is configured by forming a framework by plural square pipes and assembling square pipes to the inside of the framework formed of the square pipes, in a lattice pattern. As shown in FIG. 3, a plate 21 and a bracket 22 are welded to the lower surface side of the assembly of the square pipes, and a caster 20 that is a turning caster is mounted on the bracket 22. In the following description, the assembly of the plural square pipes is referred to as a base frame 30.

Figure 4:
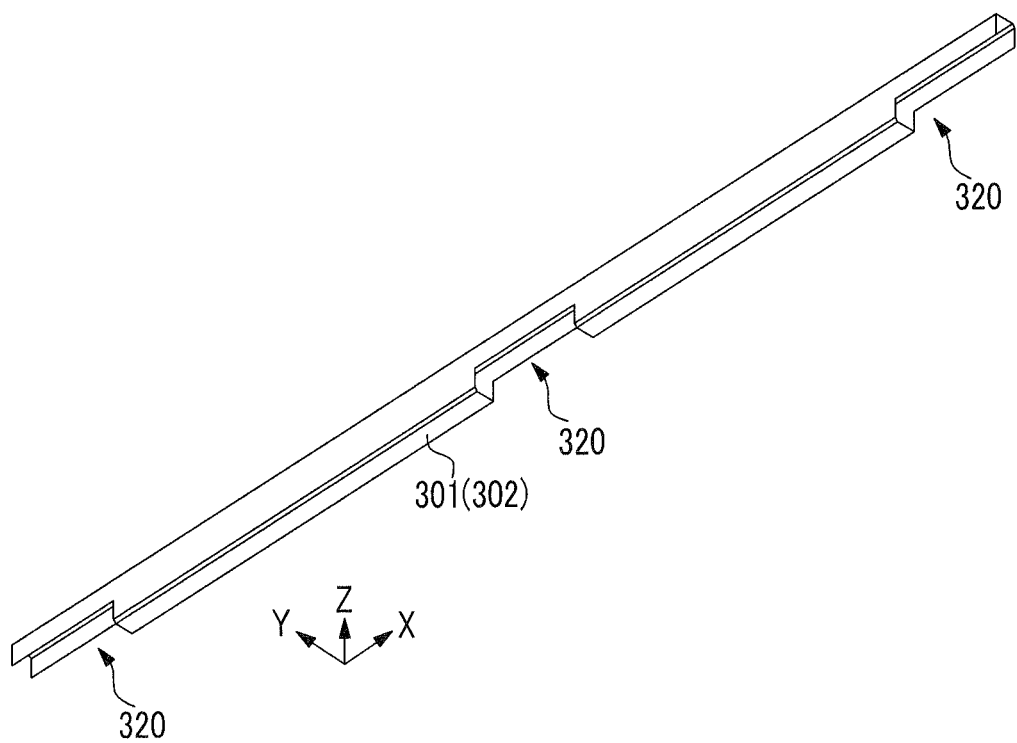
FIG. 4 is a perspective view of a square pipe.

The shape of a square pipe 301 and a square pipe 302 which are the long sides, among the square pipes configuring an outer frame of the base frame 30, is made to be a shape in which a portion of a square pipe having a rectangular cross-section is cut out, as shown in FIG. 4. Specifically, the square pipe 301 (or the square pipe 302) has a cutout portion 320. The cutout portion 320 is formed by performing cutting-out from one side surface side in which the width along a longitudinal direction of the square pipe 301 (or the square pipe 302) is narrow, to the other side surface side. In addition, the positions of the cutout portions 320 are made to be the positions of both end portions in the longitudinal direction of the square pipe 301 (or the square pipe 302) and a predetermined position (in this exemplary embodiment, a central portion in the longitudinal direction) between both end portions. Further, the lengths in the longitudinal direction of the cutout portions 320 are the same length and are made longer than the length in the longitudinal direction of a plate section 220 of the bracket 22, which will be described later.

Figure 5:
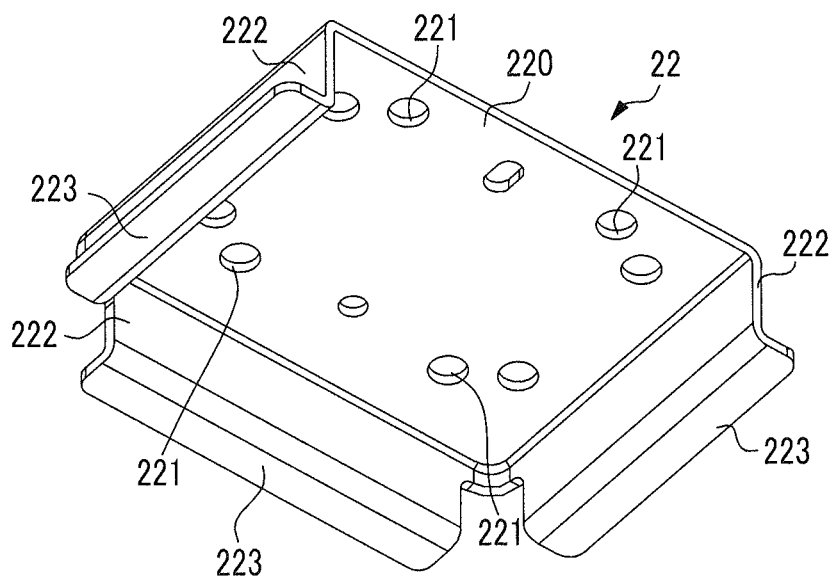
FIG. 5 is a perspective view of a bracket.

Next, FIG. 5 is a diagram showing the bracket 22 when viewed from the lower surface side. The bracket 22 is made by performing drilling work and press work on a metal plate. The bracket 22 has the flat and rectangular plate section 220 subjected to the drilling work. The plate section 220 has holes 221 through which bolts pass. Further, the bracket 22 has side surface sections 222 bent from the plate section 220 to the lower surface side and marginal sections 223 each bent in a horizontal direction from the side surface sections 222. In addition, the bracket 22 has a configuration in which the side surface sections 222 and the marginal sections 223 are present in two short side portions of the plate section 220 having a rectangular shape as viewed from the upper surface side and one long side portion of long sides of the plate section 220 and the side surface section 222 and the marginal section 223 are not provided at the other long side portion of the long sides of the plate section 220.

In the base frame 30, the square pipe 301 and the square pipe 302 are disposed at a distance along the X-axis direction such that the cutout portions 320 are located on the lower surface side. Further, an end portion on the X-axis positive direction side of the square pipe 301 is disposed so as to come into contact with a side surface of an end portion on the Y-axis positive direction side of a square pipe 303, an end portion on the X-axis positive direction side of the square pipe 302 is disposed so as to come into contact with a side surface of an end portion on the Y-axis negative direction side of the square pipe 303, and the portions that are in contact with each other are welded to each other. Further, an end portion on the X-axis negative direction side of the square pipe 301 is disposed so as to come into contact with a side surface of an end portion on the Y-axis positive direction side of a square pipe 304, an end portion on the X-axis negative direction side of the square pipe 302 is disposed so as to come into contact with a side surface of an end portion on the Y-axis negative direction side of the square pipe 304, and the portions that are in contact with each other are welded to each other.

If the square pipes 301 to 304 are welded in this manner, the shape of a frame is created, as shown in FIG. 2. Between the square pipe 301 and the square pipe 302, a square pipe 305 is disposed alongside the square pipe 301 at a distance from the square pipe 301 and a square pipe 306 is disposed alongside the square pipe 302 at a distance from the square pipe 302. One end of the square pipe 305 is welded to the side surface of the square pipe 303 and the other end of the square pipe 305 is welded to the side surface of the square pipe 304. Further, one end of the square pipe 306 is welded to the side surface of the square pipe 303 and the other end of the square pipe 306 is welded to the side surface of the square pipe 304.

Square pipes 307 to 310 are arranged at distances in the X-axis direction between the square pipe 301 and the square pipe 305, and end portions of each square pipe are respectively welded to the square pipe 301 and the square pipe 305. In addition, the square pipe 307 is disposed on the left side of the cutout portion 320 which is located on the right side as viewed from the front side, among the cutout portions 320 that the square pipe 301 has, and the square pipe 310 is disposed on the right side of the cutout portion 320 which is located on the left side as viewed from the front side, among the cutout portions 320 that the square pipe 301 has. Further, the square pipe 308 is disposed on the right side of the cutout portion 320 which is located at the center of the square pipe 301, as viewed from the front side, and the square pipe 309 is disposed on the left side of the cutout portion 320 which is located at the center of the square pipe 301, as viewed from the front side.

Here, a distance between the square pipe 303 and the square pipe 307 as viewed from the upper surface side is made to be a distance which is longer than the length in the longitudinal direction of the plate section 220 of the bracket 22, and a distance between the square pipe 304 and the square pipe 310 as viewed from the upper surface side is made to be a distance which is longer than the length in the longitudinal direction of the plate section 220 of the bracket 22. Further, a distance between the square pipe 308 and the square pipe 309 as viewed from the upper surface side is also made to be a distance which is longer than the length in the longitudinal direction of the plate section 220 of the bracket 22.

Square pipes 311 to 314 are arranged at distances in the X-axis direction between the square pipe 302 and the square pipe 306, and end portions of each square pipe are respectively welded to the square pipe 302 and the square pipe 306. In addition, the square pipe 311 is disposed on the left side of the cutout portion 320 which is located on the right side as viewed from the front side, among the cutout portions 320 that the square pipe 302 has, and the square pipe 314 is disposed on the right side of the cutout portion 320 which is located on the left side as viewed from the front side, among the cutout portions 320 that the square pipe 302 has. Further, the square pipe 312 is disposed on the right side of the cutout portion 320 which is located at the center of the square pipe 302, as viewed from the front side, and the square pipe 313 is disposed on the left side of the cutout portion 320 which is located at the center of the square pipe 302, as viewed from the front side.

Here, a distance between the square pipe 303 and the square pipe 311 as viewed from the upper surface side is made to be a distance which is longer than the length in the longitudinal direction of the plate section 220 of the bracket 22, and a distance between the square pipe 304 and the square pipe 314 as viewed from the upper surface side is made to be a distance which is longer than the length in the longitudinal direction of the plate section 220 of the bracket 22. Further, a distance between the square pipe 312 and the square pipe 313 as viewed from the upper surface side is also made to be a distance which is longer than the length in the longitudinal direction of the plate section 220 of the bracket 22.

Figure 6:
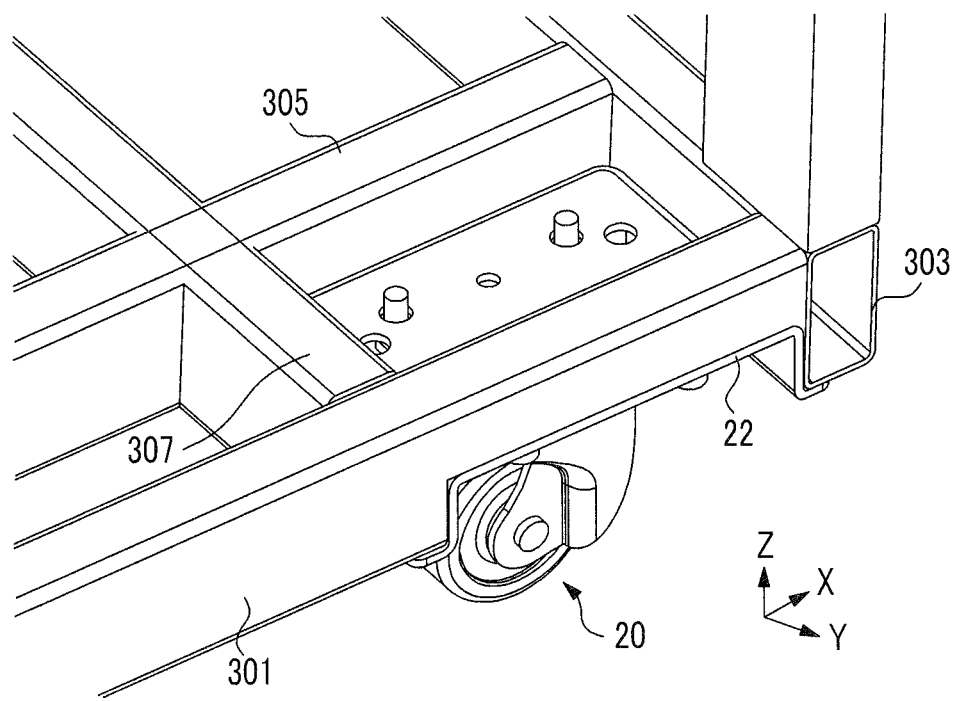
FIG. 6 is an enlarged perspective view of a front lower right portion of the frame.
Figure 7:
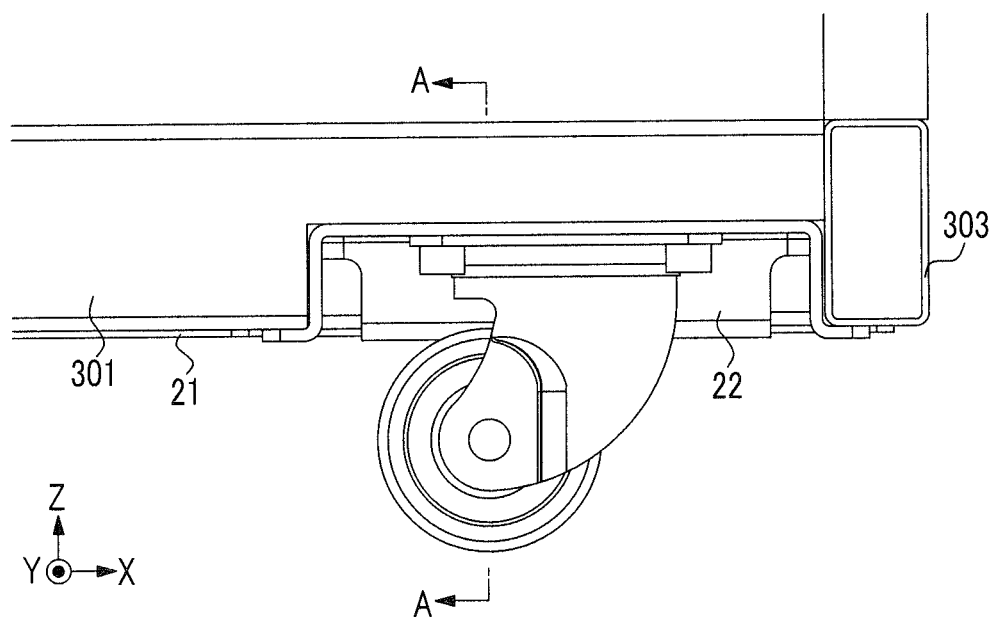
FIG. 7 is a front view of the front lower right portion of the frame.
Figure 8:
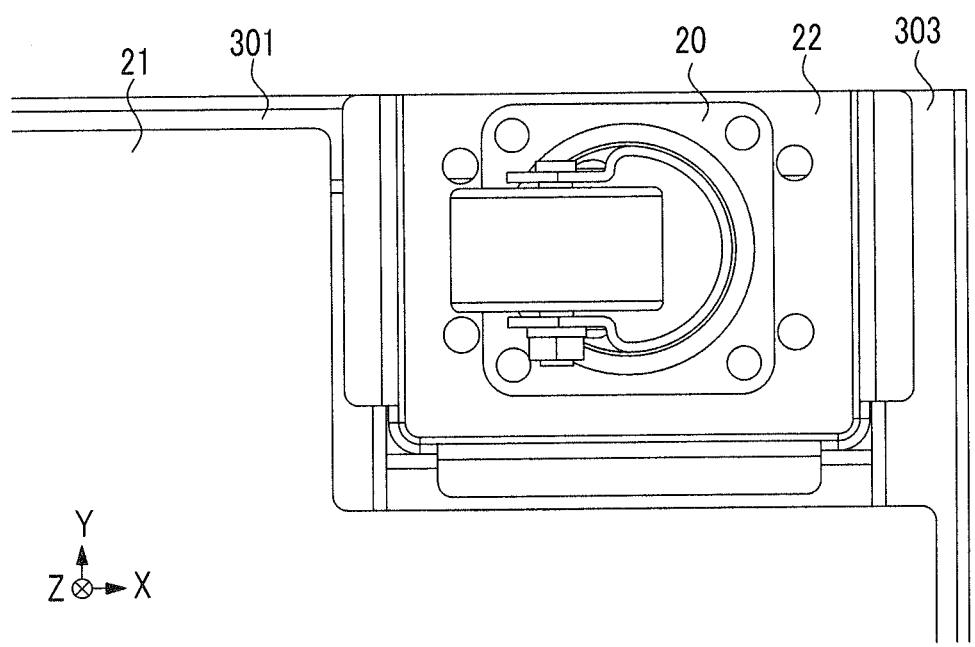
FIG. 8 is a diagram showing the front lower right portion of the frame when viewed from the lower surface side.

On the base frame 30 in which the square pipes are welded as described above, the caster 20 is mounted by using the bracket 22. FIG. 6 is an enlarged perspective view of the portion of the caster 20 which is located on the right side when the base frame 30 is viewed from the front side. Further, FIG. 7 is a front view of the portion shown in FIG. 6, FIG. 8 is a diagram when the portion shown in FIG. 6 is viewed from the lower surface side, and FIG. 9 is a cross-sectional view taken along line A-A of FIG. 7 and viewed from in the direction of an arrow.

The plate section 220 of the bracket 22 is inserted into the portion surrounded by the square pipes 303, 305, and 307 from the lower surface side, and after the upper surface sides of the marginal sections 223 are brought into contact with the lower surfaces of the square pipes 303, 305, and 307, the marginal sections 223 are welded to the lower surfaces of the square pipes 303, 305, and 307. Here, since the cutout portion 320 is present in the end portion of the square pipe

Figure 9:
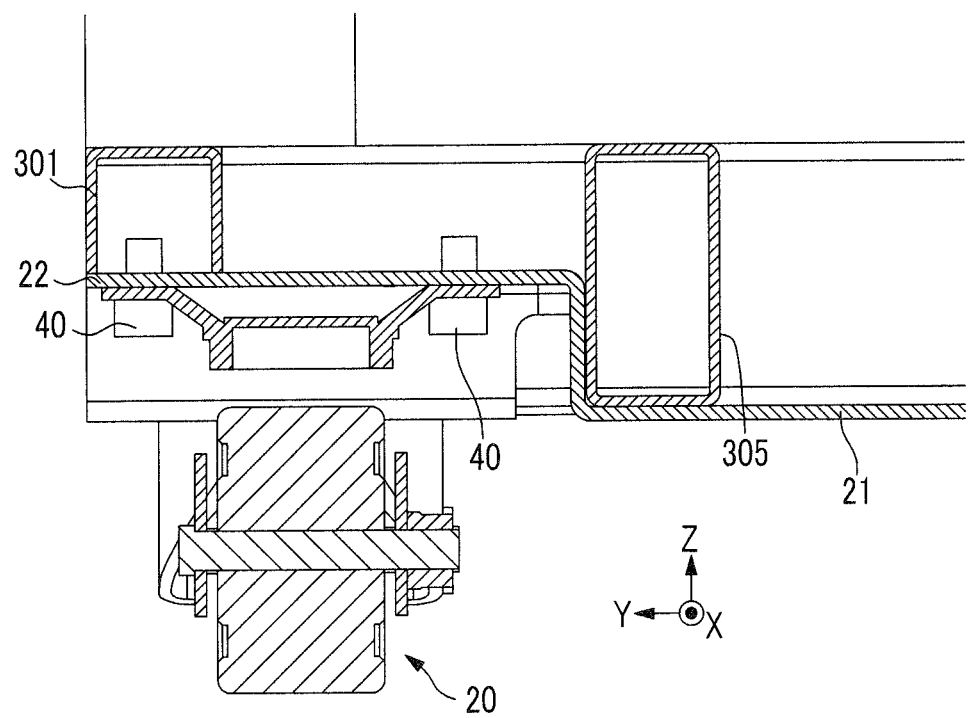
FIG. 9 is a cross-sectional view taken along line A-A of FIG. 7 and viewed from in the direction of an arrow.

301, as shown in FIGS. 6 and 9, in the plate section 220, the side where the side surface section 222 and the marginal section 223 are not provided is fitted into the cutout portion 320. In the plate section 220, the portion which comes into contact with the cutout portion 320 is also welded.

In the square pipe 301, the portion in which the cutout portion 320 is present has a form in which an internal space communicates with the outside due to cutting-out of a portion of the square pipe 301, before the bracket 22 is welded thereto.

However, the plate section 220 is welded to the cutout portion 320, whereby the portion which communicates with the outside is blocked, and thus the shape of a square pipe is made in a pseudo manner.

In addition, in the front side of the base frame 30, also in the portion surrounded by the square pipes 305, 308, and 309, the bracket 22 is inserted into and welded to the portion, similarly to the portion of FIG. 6. Here, since the cutout portion 320 is present between the square pipe 308 and the square pipe 309 as viewed from the front side, in the plate section 220 of the bracket 22, the side where the side surface section 222 and the marginal section 223 are not provided is fitted into the cutout portion 320. Further, also in the portion surrounded by the square pipes 304, 305, and 310, the bracket 22 is inserted into and welded to the portion, similarly to the portion of FIG. 6. Here, since the cutout portion 320 is present in the end portion of the square pipe 301, in the plate section 220 of the bracket 22, the side where the side surface section 222 and the marginal section 223 are not provided is fitted into the cutout portion 320.

Further, in the back side of the base frame 30, the plate section 220 of the bracket 22 is inserted into the portion surrounded by the square pipes 303, 306, and 311 from the lower surface side, and after the upper surfaces of the marginal sections 223 are brought into contact with the lower surfaces of the square pipes 303, 306, and 311, the marginal sections 223 are welded to the lower surfaces of the square pipes 303, 306, and 311. Here, since the cutout portion 320 is present in the end portion of the square pipe 302, in the plate section 220, the side where the side surface section 222 and the marginal section 223 are not provided is fitted into the cutout portion 320.

In addition, in the back side of the base frame 30, also in the portion surrounded by the square pipes 306, 312, and 313 and the portion surrounded by the square pipes 304, 306, and 314, the brackets 22 are inserted into and welded to the portions, similarly to the portion of FIG. 6, and a portion of each of the plate sections 220 of the brackets 22 is fitted into the cutout portion 320.

Then, the caster 20 is mounted on the bracket 22 welded to the base frame 30 in this manner. Specifically, bolts 40 pass through mounting holes provided in a mounting seat of the caster 20 and the holes 221 provided in the bracket 22 from the lower surface side, and nuts (not shown) are fitted onto the bolts 40 protruding to the upper surface side of the bracket 22. If the nuts are tightened, the mounting seat is pressed against the bracket 22 by the bolts 40 and the mounting seat of the caster 20 is fixed to the bracket 22.

Figure 10:
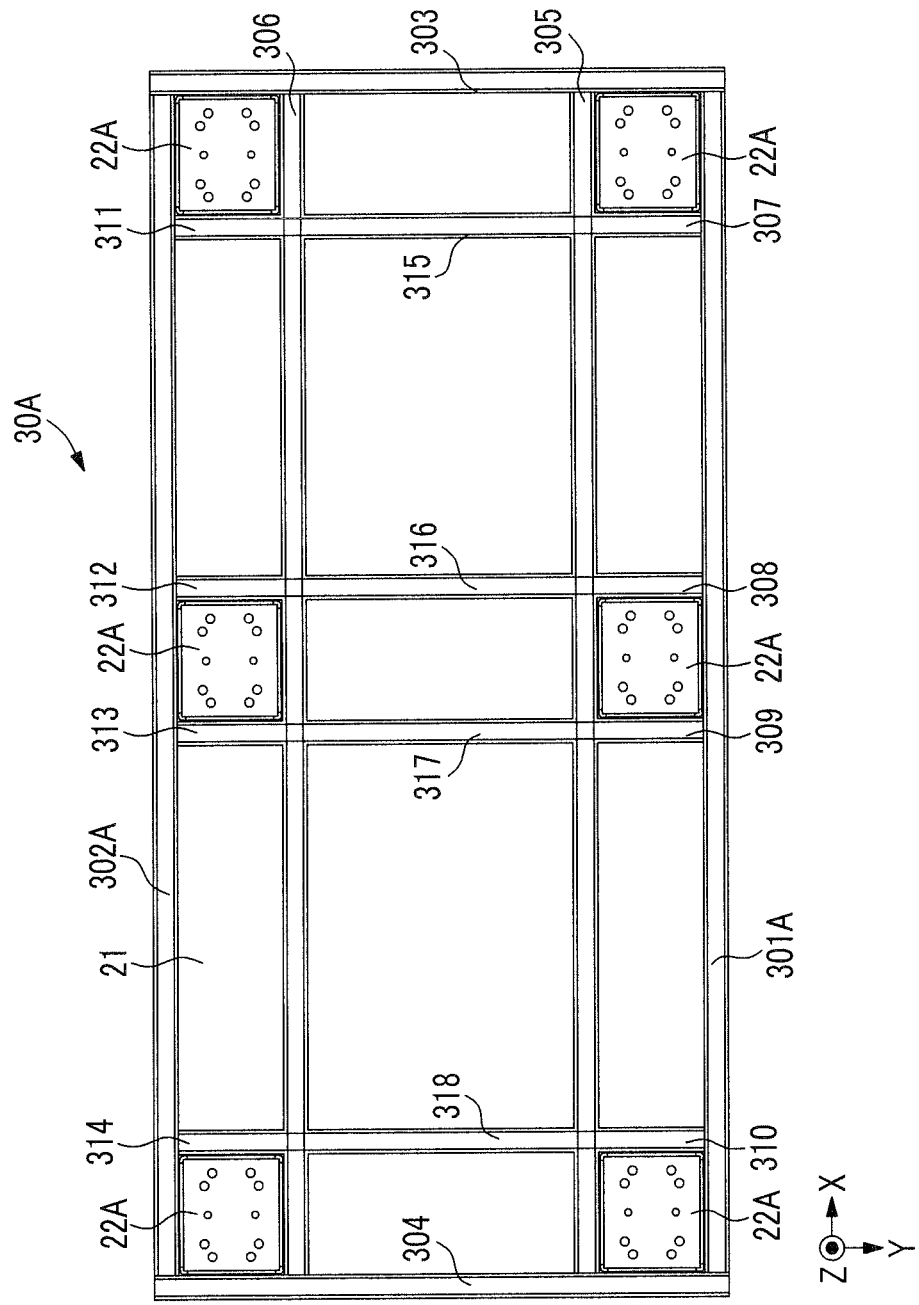
FIG. 10 is a diagram showing a base frame when viewed from the upper surface side.
Figure 11:
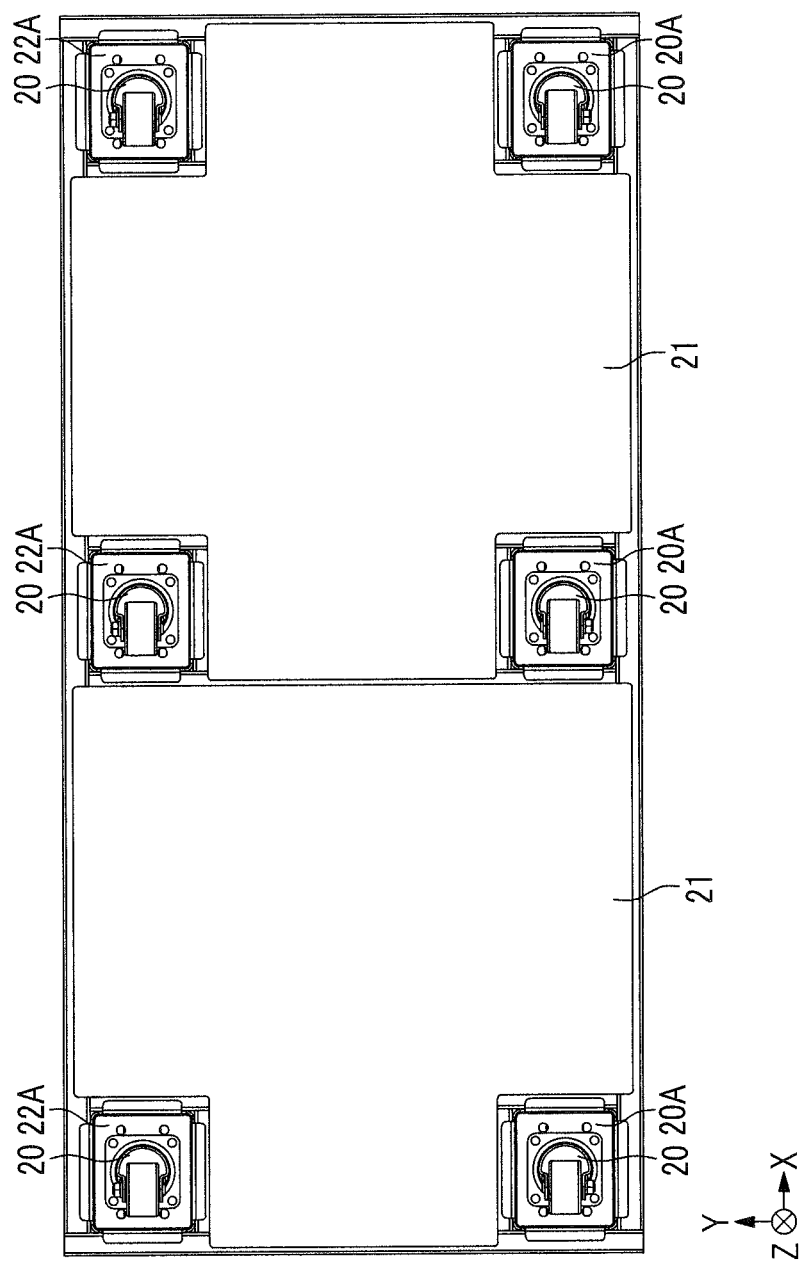
FIG. 11 is a diagram showing the base frame when viewed from the lower surface side.

Here, for comparison, a frame adopting square pipes in which the cutout portion 320 is not provided will be described. FIG. 10 is a diagram when a base frame 30A adopting a square pipe 301A and a square pipe 302A in which the cutout portion 320 is not provided is viewed from the upper surface side, FIG. 11 is a diagram showing the base frame 30A when viewed from the lower surface side, FIG. 12 is a perspective view of the square pipe 301A (or the square pipe 302A), and FIG. 13 is a perspective view of a bracket 22A which is mounted on the base frame 30A.

Figure 12:
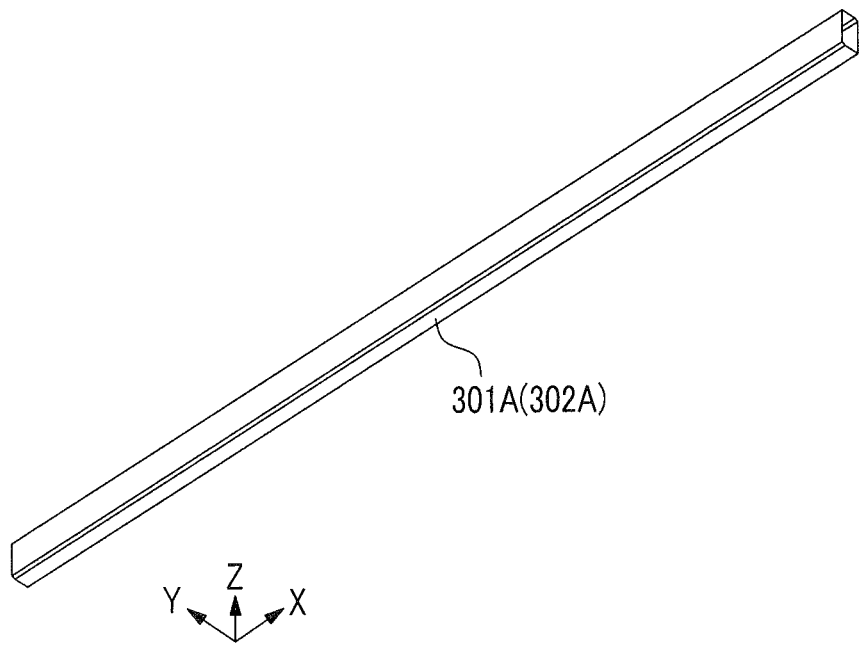
FIG. 12 is a perspective view of a square pipe.

The shape of the square pipe 301A and the square pipe 302A is made to be a shape in which the cutout portion 320 is not provided, as shown in FIG. 12. As shown in FIG. 10, the base frame 30A uses the square pipe 301A instead of the square pipe 301 and uses the square pipe 302A instead of the square pipe 302. Then, as shown in FIG. 11, the plate 21 and the bracket 22A are welded to the lower surface side of a framework formed of the square pipes and the caster 20 is mounted on the bracket 22A.

Figure 13:
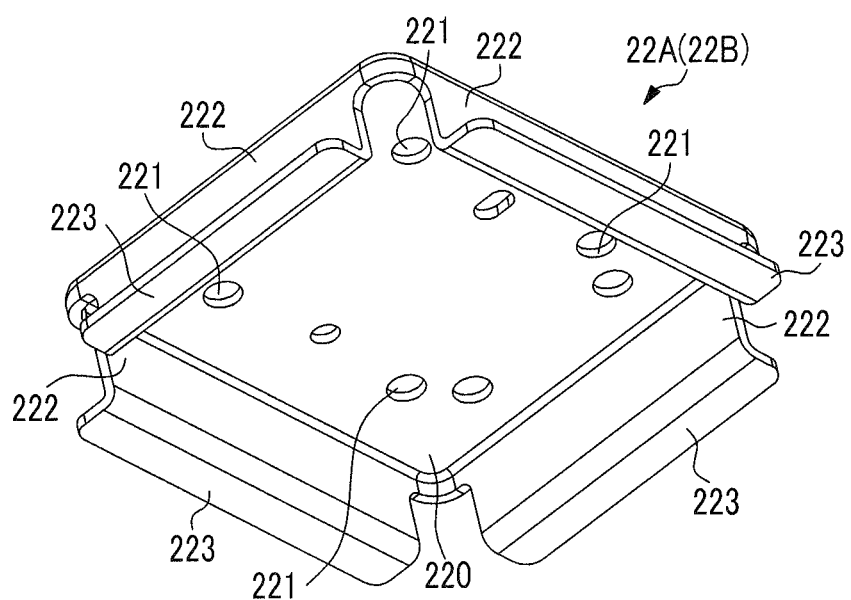
FIG. 13 is a perspective view of a bracket.

In the bracket 22A, as shown in FIG. 13, the side surface sections 222 and the marginal sections 223 are present in two short side portions of the plate section 220 having a rectangular shape as viewed from the upper surface side and two long side portions of the plate section 220, and each side surface section 222 has the marginal section 223 bent in the horizontal direction.

Figure 14:
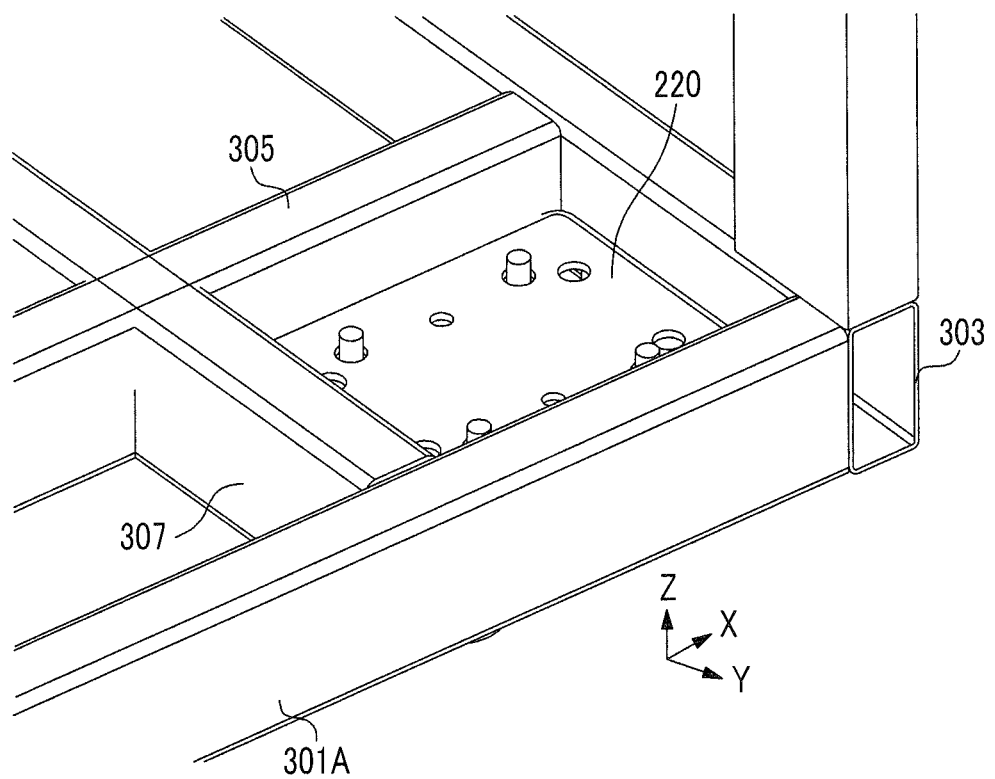
FIG. 14 is an enlarged perspective view of a front lower right portion of a frame using the base frame.
Figure 15:
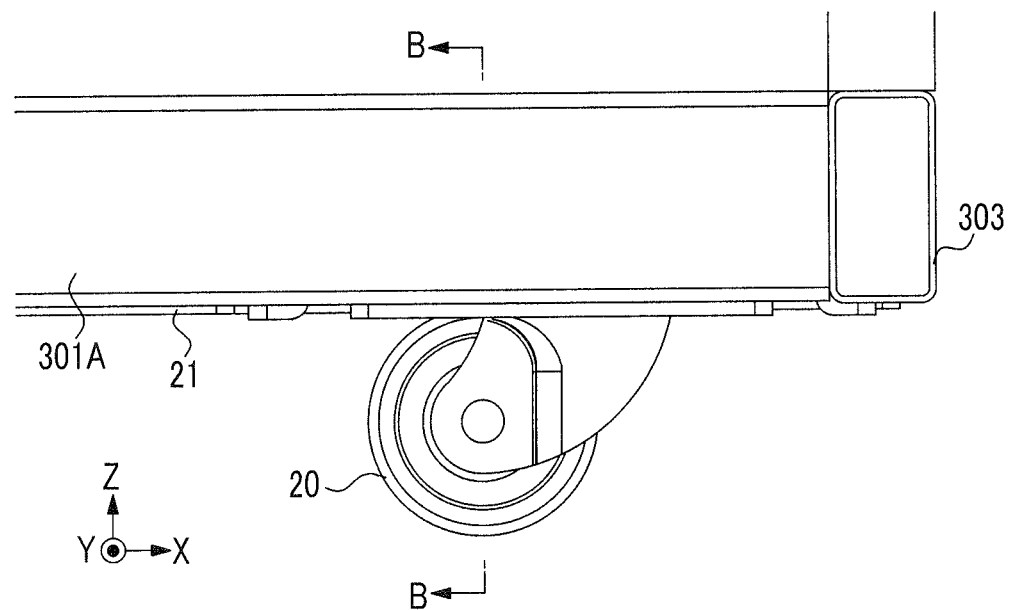
FIG. 15 is a front view of the front lower right portion of the frame using the base frame.
Figure 16:
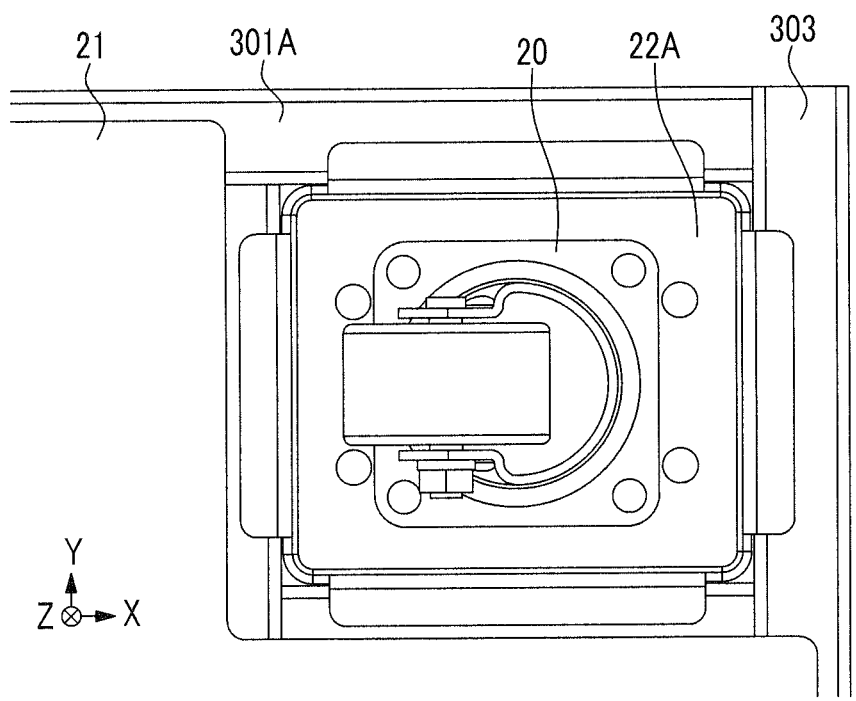
FIG. 16 is a diagram showing the front lower right portion of the frame using the base frame when viewed from the lower surface side.
Figure 17:
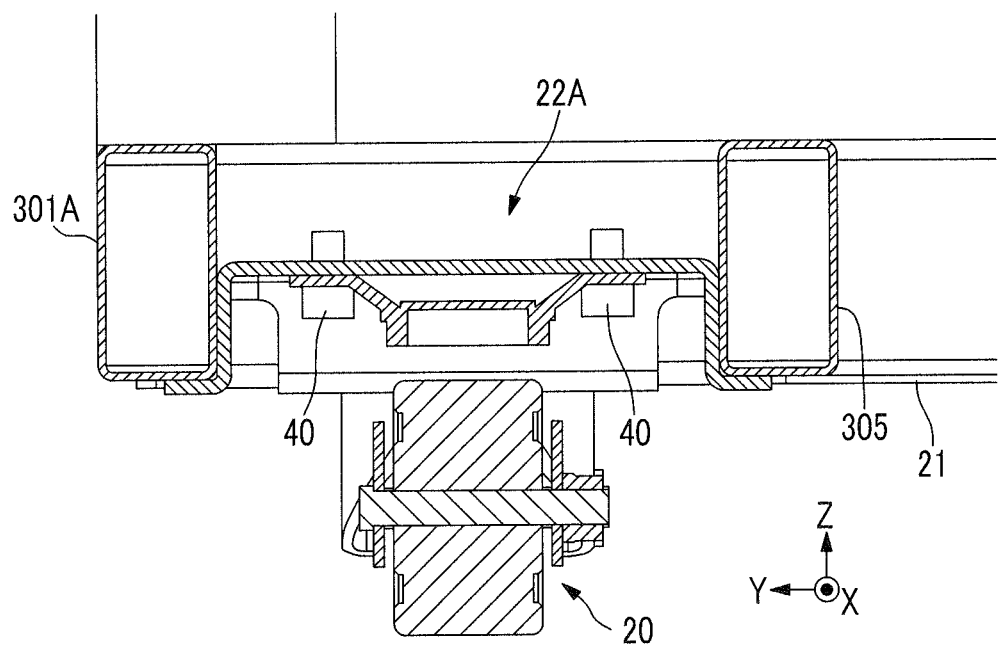
FIG. 17 is a cross-sectional view taken along line B-B of FIG. 15 and viewed from the direction of an arrow.

Next, FIG. 14 is an enlarged perspective view of the portion of a right end of the base frame 30A as viewed from the front side, FIG. 15 is a front view of the portion shown in FIG. 14, FIG. 16 is a diagram when the portion shown in FIG. 14 is viewed from the lower surface side, and FIG. 17 is a cross-sectional view taken along line B-B of FIG. 15 and viewed from the direction of an arrow.

If the square pipe 301A is adopted instead of the square pipe 301, since the cutout portion 320 is not present in the square pipe 301A, as shown in FIG. 12, when the bracket 22A is inserted into a space surrounded by the square pipes 301A, 303, 305, and 307 from the lower surface side, the plate section 220 and the side surface sections 222 of the bracket 22A are fitted into the space, as shown in FIG. 17. Further, the brackets 22A are also inserted into a space surrounded by the square pipes 301A, 305, 308, and 309 and a space surrounded by the square pipes 301A, 304, 305, and 310 from the lower surface side, and the plate sections 220 and the side surface sections 222 are fitted into the spaces.

Here, since the cutout portion 320 is not present in the square pipe 301A, whereby the plate section 220 of the bracket 22A cannot be located further to the front side than the square pipe 301A, compared to the bracket 22 inserted into the base frame 30, the plate section 220 of the bracket 22A is located on the back side by a distance corresponding to the width in the Y-axis direction of the square pipe 301A.

Further, also in the back side, if the square pipe 302A is adopted instead of the square pipe 302, since the cutout portion 320 is not present in the square pipe 302A, when the bracket 22A is inserted into a space surrounded by the square pipes 302A, 303, 306, and 311 from the lower surface side, the plate section 220 and the side surface sections 222 of the bracket 22A are fitted into the space. Further, the brackets 22A are also inserted into a space surrounded by the square pipes 302A, 306, 312, and 313 and a space surrounded by the square pipes 302A, 304, 306, and 314 from the lower surface side, and the plate sections 220 and the side surface sections 222 are fitted into the spaces.

Here, since the cutout portion 320 is not present in the square pipe 302A, whereby the bracket 22A cannot be located further to the back side than the square pipe 302A, compared to the bracket 22 inserted into the base frame 30, the bracket 22A which is located on the back side is located on the front side by a distance corresponding to the width in the Y-axis direction of the square pipe 302A.

The bracket 22A is inserted until the marginal sections 223 come into contact with the square pipes, as shown in FIG. 17, and the marginal sections 223 are welded to the square pipes. The caster 20 is mounted on the bracket 22A welded to the base frame 30A in this manner. Specifically, the bolts 40 pass through the mounting holes provided in the mounting seat of the caster 20 and the holes 221 provided in the bracket 22A from the lower surface side, and nuts (not shown) are fitted onto the bolts 40 protruding to the upper surface side of the bracket 22A. If the nuts are tightened, the mounting seat is pressed against the bracket 22A by the bolts 40 and the mounting seat of the caster 20 is fixed to the bracket 22A.

In the base frame 30A, since the cutout portion 320 is not present in the square pipe 301A, as shown in FIGS. 16 and 17, the plate section 220 of the bracket 22A is not located further to the front side than the square pipe 301A and the caster 20 comes away from an edge of the base frame 30A as viewed from the upper surface side. On the other hand, in this exemplary embodiment, since the cutout portion 320 is present in the square pipe 301, as shown in FIG. 9, the plate section 220 of the bracket 22 is located further to the front side than in the configuration of FIG. 17. In this way, since the holes 221 of the plate section 220 are located further to the front side than in the configuration of FIG. 17, the caster 20 becomes near an edge of the base frame 30, as viewed from the upper surface side.

Further, also in the back side, in the base frame 30A, since the cutout portion 320 is not present in the square pipe 302A, the plate section 220 of the bracket 22A is not located on the back side and the caster 20 comes away from an edge of the base frame 30A, as viewed from the upper surface side. On the other hand, in this exemplary embodiment, since the cutout portion 320 is present in the square pipe 302, the plate section 220 of the bracket 22 is located further to the back side. In this way, the caster 20 becomes near an edge of the base frame 30, as viewed from the upper surface side.

Compared to a configuration in which the cutout portions 320 are not provided in the square pipe 301 and the square pipe 302, in this exemplary embodiment, since a distance between the caster 20 on the front side and the caster 20 on the back side becomes wide, the frame 10 does not easily fall down to the front side or the back side.

Further, in this exemplary embodiment, the brackets 22 are inserted into the spaces surrounded by the square pipes assembled in a lattice pattern and the casters 20 are mounted on the brackets 22. Compared to the configuration in which the casters 20 are mounted on the lower surfaces of the squared pipe 301A and the squared pipe 302A in the base frame 30A, since the lower surface of the base frame 30 is located below the position of the mounting seat of the caster 20, the height of the frame 10 becomes low.

Further, in this exemplary embodiment, since the casters 20 are exposed to the front side and the back side, the bolts 40 can be rotated from the front side or the back side.

Second Exemplary Embodiment

Next, a second exemplary embodiment of the invention will be described. The second exemplary embodiment is different from the first exemplary embodiment in that instead of the base frame 30, a base frame 30B is provided. The base frame 30B is different from the base frame 30 in that the base frame 30B includes a square pipe 301B instead of the square pipe 301 and includes a square pipe 302B instead of the square pipe 302. In addition, other configurations are common to those in the first exemplary embodiment. Therefore, in the following description and drawings, constituent elements which are common to those in the first exemplary embodiment are denoted by the reference numerals used in the first exemplary embodiment and description thereof is omitted.

Figure 18:
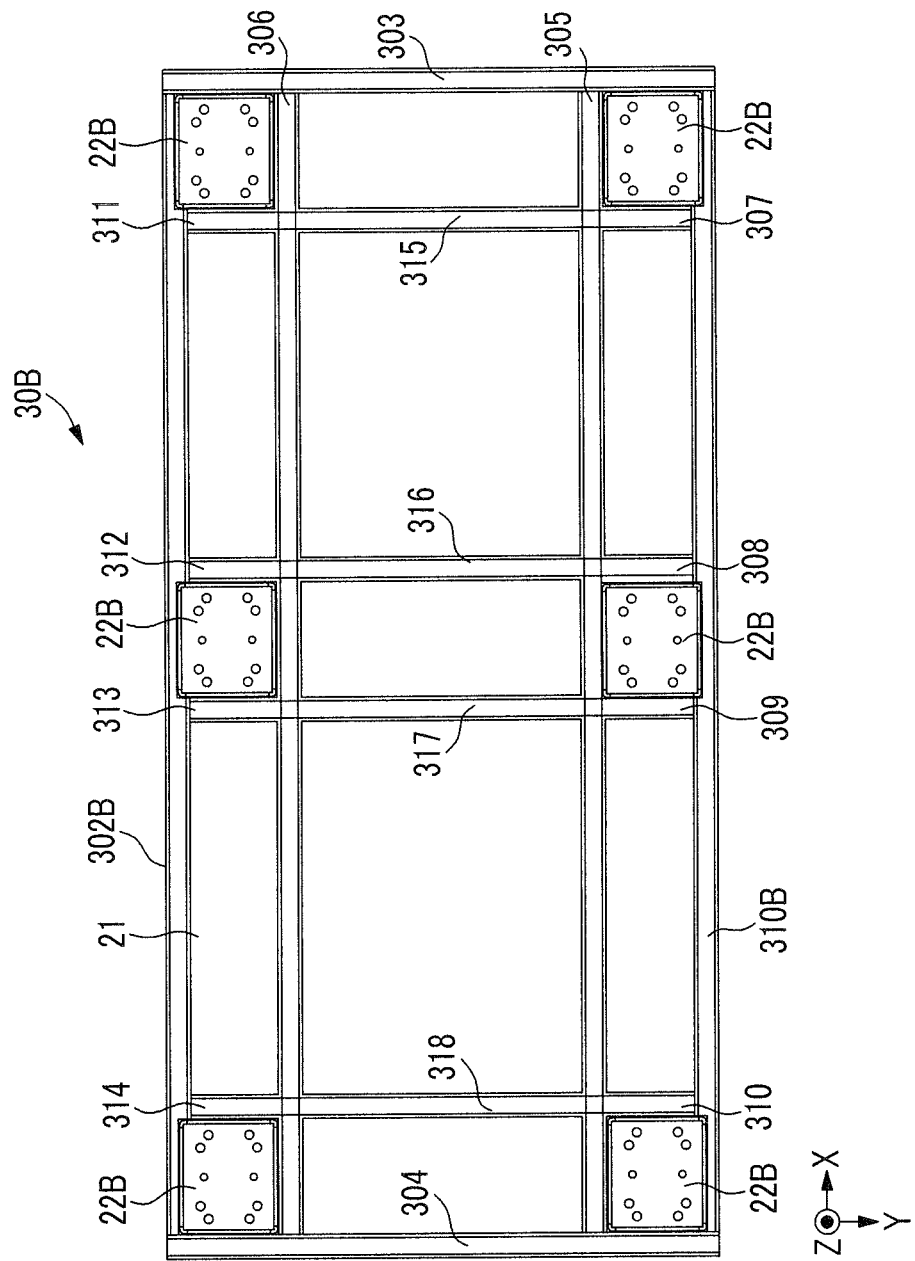
FIG. 18 is a diagram showing a base frame when viewed from the upper surface side.
Figure 19:
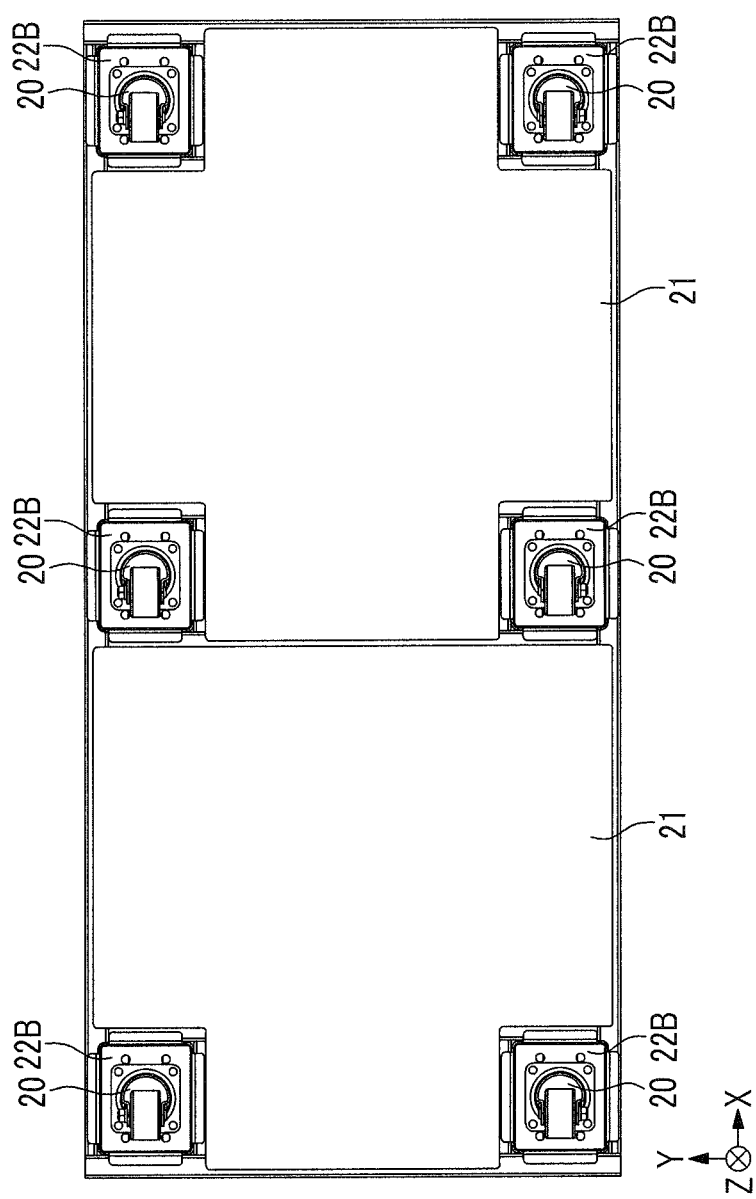
FIG. 19 is a diagram showing the base frame when viewed from the lower surface side.
Figure 20:
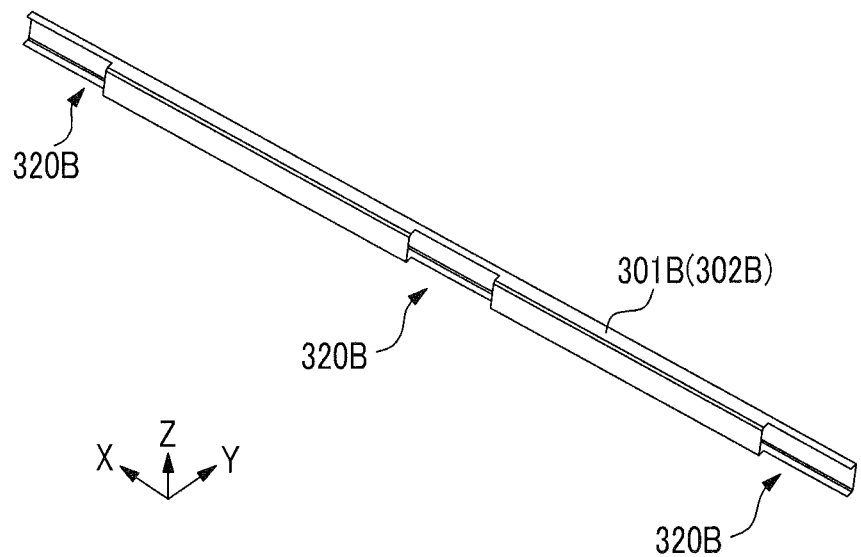
FIG. 20 is a perspective view of a square pipe.

FIG. 18 is a diagram when the base frame 30B adopting the square pipe 301B and the square pipe 302B is viewed from the upper surface side, FIG. 19 is a diagram showing the base frame 30B when viewed from the lower surface side, and FIG. 20 is a perspective view of the square pipe 301B (or the square pipe 302B). In addition, a bracket 22B is welded to the base frame 30B. The shape of the bracket 22B is the same shape as that of the bracket 22A shown in FIG. 13 and the height in the Z-axis direction of the side surface section 222 is made higher than that in the bracket 22A.

The shape of the square pipe 301B and the square pipe 302B which are the long sides, among the square pipes configuring an outer frame of the base frame 30B, is made to be a shape in which a portion of a square pipe having a rectangular cross-section is cut out, as shown in FIG. 20. Specifically, the square pipe 301B (or the square pipe 302B) has a cutout portion 320B. The cutout portion 320B is formed by performing cutting-out from one side surface side in which the width along a longitudinal direction of the square pipe 301B (or the square pipe 302B) is wide, to the other side surface side. In addition, the positions of the cutout portions 320B are made to be the positions of both end portions in the longitudinal direction of the square pipe 301B (or the square pipe 302B) and a predetermined position (in this exemplary embodiment, a central portion in the longitudinal direction) between both end portions. Further, the lengths in the longitudinal direction of the cutout portions 320B are the same length and are made longer than the length in the longitudinal direction of a place section 220 of the bracket 22B.

In the base frame 30B, the square pipe 301B and the square pipe 302B are disposed side by side such that the cutout portion 320B of the square pipe 301B faces the back side and the cutout portion 320B of the square pipe 302B faces the front side. Further, an end portion on the X-axis positive direction side of the square pipe 301B is disposed so as to come into contact with an end portion of the side surface on the Y-axis positive direction side of the square pipe 303, an end portion on the X-axis positive direction side of the square pipe 302B is disposed so as to come into contact with an end portion of the side surface on the Y-axis negative direction side of the square pipe 303, and the portions that are in contact with each other are welded to each other. Further, an end portion on the X-axis negative direction side of the square pipe 301B is disposed so as to come into contact with an end portion of the side surface on the Y-axis positive direction side of the square pipe 304, an end portion on the X-axis negative direction side of the square pipe 302B is disposed so as to come into contact with an end portion of the side surface on the Y-axis negative direction side of the square pipe 304, and the portions that are in contact with each other are welded to each other.

The square pipes 307 to 310 are arranged at distances in the X-axis direction between the square pipe 301B and the square pipe 305, and end portions of each square pipe are respectively welded to the square pipe 301B and the square pipe 305. In addition, the square pipe 307 is disposed on the left side of the cutout portion 320B which is located on the right side as viewed from the front side, among the cutout portions 320 that the square pipe 301B has, and the square pipe 310 is disposed on the right side of the cutout portion 320B which is located on the left side as viewed from the front side, among the cutout portions 320B that the square pipe 301B has. Further, the square pipe 308 is disposed on the right side of the cutout portion 320B which is located at the center of the square pipe 301B, as viewed from the front side, and the square pipe 309 is disposed on the left side of the cutout portion 320B which is located at the center of the square pipe 301B, as viewed from the front side.

The square pipes 311 to 314 are arranged at distances in the X-axis direction between the square pipe 302B and the square pipe 306, and end portions of each square pipe are respectively welded to the square pipe 302B and the square pipe 306. The square pipe 311 is disposed on the left side of the cutout portion 320B which is located on the right side as viewed from the front side, among the cutout portions 320B that the square pipe 302B has, and the square pipe 314 is disposed on the right side of the cutout portion 320B which is located on the left side as viewed from the front side, among the cutout portions 320B that the square pipe 302B has. Further, the square pipe 312 is disposed on the right side of the cutout portion 320B which is located at the center of the square pipe 302B, as viewed from the front side, and the square pipe 313 is disposed on the left side of the cutout portion 320B which is located at the center of the square pipe 302B, as viewed from the front side.

Figure 21:
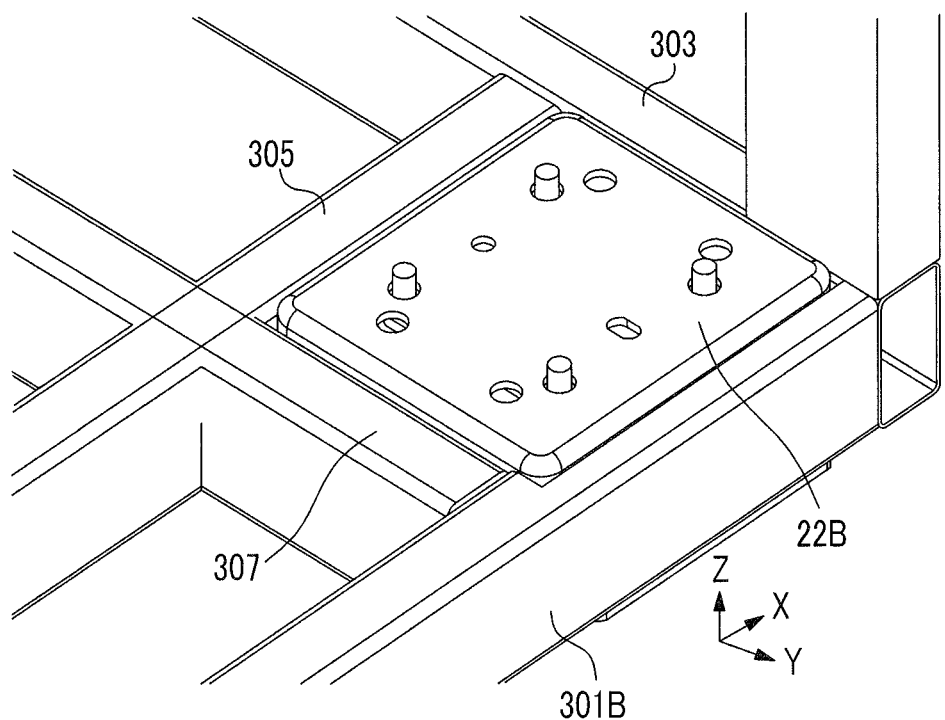
FIG. 21 is an enlarged perspective view of a front lower right portion of a frame using the base frame.
Figure 22:
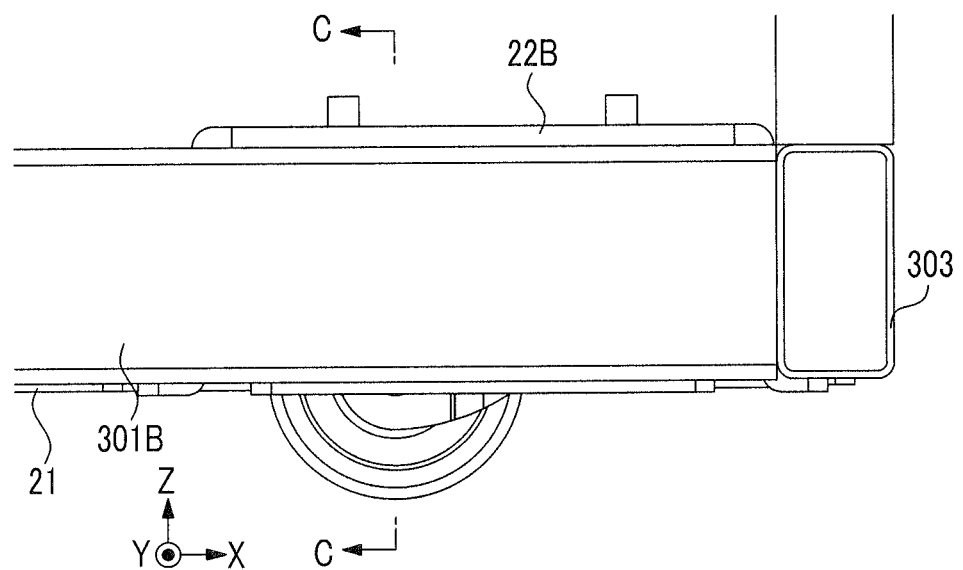
FIG. 22 is a front view of the front lower right portion of the frame using the base frame.
Figure 23:
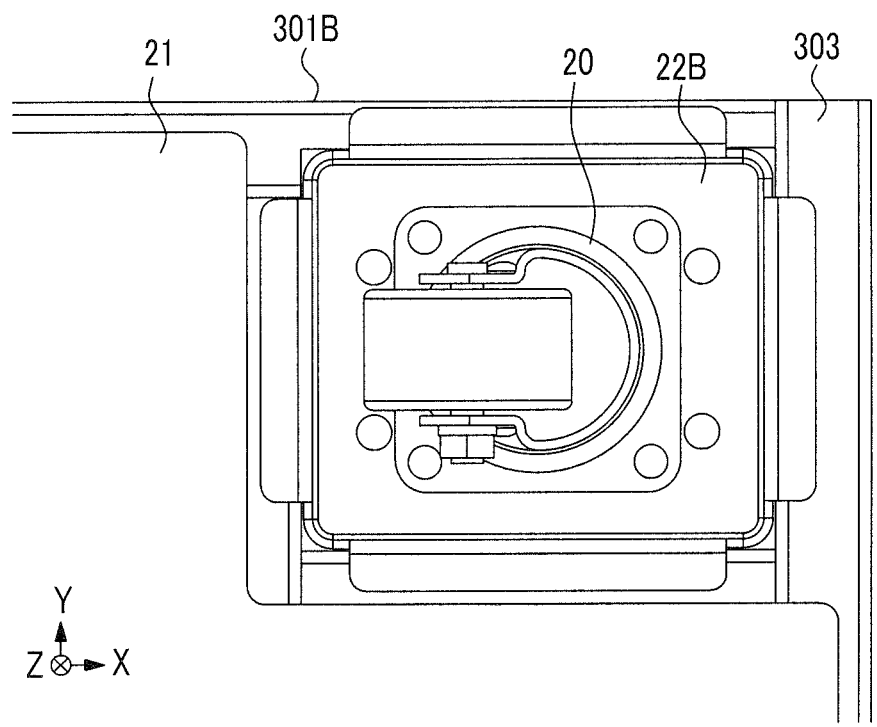
FIG. 23 is a diagram showing the front lower right portion of the frame using the base frame when viewed from the lower surface side.
Figure 24:
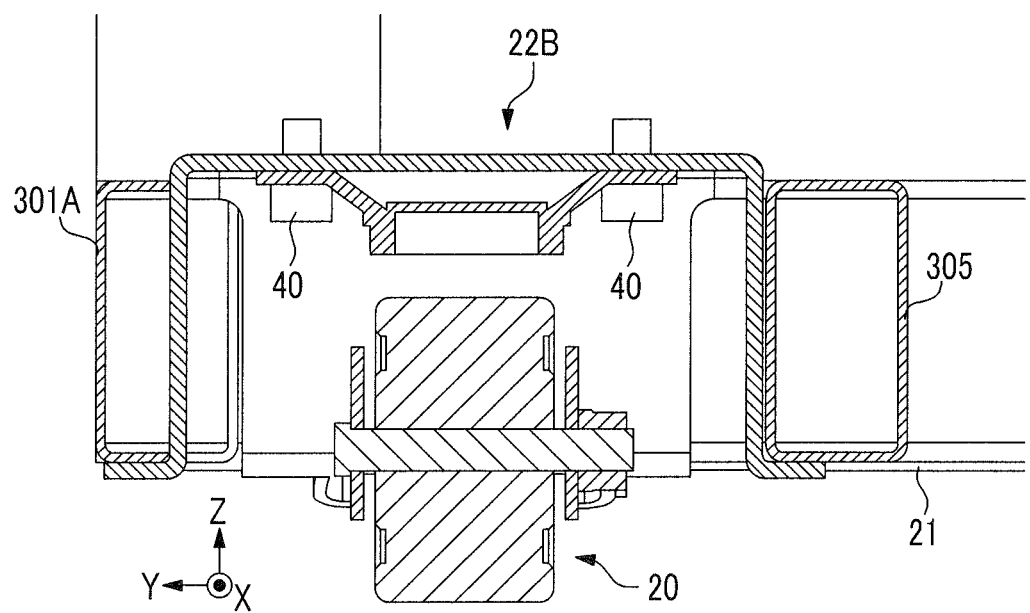
FIG. 24 is a cross-sectional view taken along line C-C of FIG. 22 and viewed from the direction of an arrow.

FIG. 21 is an enlarged perspective view of the portion of the caster 20 which is located on the right side of the base frame 30B as viewed from the front side. Further, FIG. 22 is a front view of the portion shown in FIG. 21, FIG. 23 is a diagram when the portion shown in FIG. 21 is viewed from the lower surface side, and FIG. 24 is a cross-sectional view taken along line C-C of FIG. 22 and viewed from the direction of an arrow.

The plate section 220 of the bracket 22B is inserted into the portion surrounded by the square pipes 301B, 303, 305, and 307 from the lower surface side, and after the upper surfaces of the marginal sections 223 are brought into contact with the lower surfaces of the square pipes 301B, 303, 305, and 307, the marginal sections 223 are welded to the lower surfaces of the square pipes 301B, 303, 305, and 307. Here, since in the end portion of the square pipe 301B, the cutout portion 320B is present on the square pipe 305 side, as shown in FIGS. 21 and 24, a portion of the bracket 22B is fitted into the cutout portion 320B.

In the square pipe 301B, the portion in which the cutout portion 320B is present has a form in which an internal space communicates with the outside due to cutting-out of a portion of the square pipe 301B, before the bracket 22B is welded thereto. However, if the marginal section 223 is welded in a state where the side surface section 222 comes into contact with the cutout portion 320B, the portion which communicates with the outside is blocked, and thus the shape of a square pipe in a pseudo manner is made.

In addition, in the front side of the base frame 30B, also in the portion surrounded by the square pipes 301B, 305, 308, and 309, the bracket 22B is inserted into and welded to the portion, similarly to the portion of FIG. 21. Here, since the cutout portion 320B is present between the square pipe 308 and the square pipe 309 as viewed from the front side, a portion of the bracket 22B is fitted into the cutout portion 320B. Further, also in the portion surrounded by the square pipes 301B, 304, 305, and 310, the bracket 22B is inserted into and welded to the portion, similarly to the portion of FIG. 21. Here, since the cutout portion 320B is present in the end portion of the square pipe 301B, a portion of the bracket 22B is fitted into the cutout portion 320B.

Further, in the back side of the base frame 30B, the plate section 220 of the bracket 22B is inserted into the portion surrounded by the square pipes 302B, 303, 306, and 311 from the lower surface side, and after the upper surfaces of the marginal sections 223 are brought into contact with the lower surfaces of the square pipes 302B, 303, 306, and 311, the marginal sections 223 are welded to the lower surfaces of the square pipes 302B, 303, 306, and 311. Here, since the cutout portion 320B is present in the end portion of the square pipe 302B, a portion of the bracket 228 is fitted into the cutout portion 320B.

In addition, in the back side of the base frame 30B, also in the portion surrounded by the square pipes 302B, 306, 312, and 313 and the portion surrounded by the square pipes 302B, 304, 306, and 314, the brackets 22B are welded to the portions, similarly to the portion of FIG. 21, and a portion of each of the brackets 22B is fitted into the cutout portion 320B.

Then, the caster 20 is mounted on the bracket 22B welded to the base frame 30B in this manner. Specifically, the bolts 40 pass through the mounting holes provided in the mounting seat of the caster 20 and the holes 221 provided in the bracket 228 from the lower surface side, and nuts (not shown) are fitted onto the bolts 40 protruding to the upper surface side of the bracket 22B. If the nuts are tightened, the mounting seat is pressed against the bracket 22B by the bolts 40 and the mounting seat of the caster 20 is fixed to the bracket 22B.

In the second exemplary embodiment, since the cutout portion 320B is present on the square pipe 305 side of the square pipe 301B of a framework, as shown in FIG. 24, the bracket 22B is located further to the front side than in the configuration of FIG. 17. In this way, since the holes 221 of the plate section 220 are located further to the front side than in the configuration of FIG. 17, the caster 20 becomes close to an edge of the base frame 30B, as viewed from the upper surface side.

Further, also in the back side, in the second exemplary embodiment, since the cutout portion 320B is present on the square pipe 306 side of the square pipe 302B of the framework, the bracket 22B is located further to the back side than in the configuration of FIG. 17. In this way, since the holes 221 of the plate section 220 are located further to the back side than in the configuration of FIG. 17, the caster 20 becomes close to an edge of the base frame 30B, as viewed from the upper surface side.

Compared to a configuration in which the cutout portion 320 is not provided, in the second exemplary embodiment, since a distance between the caster 20 on the front side and the caster 20 on the back side becomes wide, the frame 10 does not easily fall down to the front side or the back side.

Further, in the second exemplary embodiment, the brackets 22B are inserted into the spaces surrounded by the square pipes assembled in a lattice pattern and the casters 20 are mounted on the brackets 22B. Compared to the configuration in which the casters 20 are mounted on the lower surfaces of the squared pipe 301A and the squared pipe 302A in the base frame 30A, since the lower surface of the base frame 30B is located below the position of the mounting seat of the caster 20, the height of the frame 10 becomes low.

Modified Examples

The exemplary embodiments of the invention have been described above. However, the invention is not limited to the above-described exemplary embodiments and can be implemented in various other forms. For example, the invention may also be implemented by modifying the above-described exemplary embodiments as follows. In addition, each of the above-described exemplary embodiments and each of the following modified examples may also be combined.

In the exemplary embodiments described above, an electronic apparatus which includes the base frame 30 or the base frame 30B is set to be an image forming apparatus.

However, an apparatus which includes the base frame 30 or the base frame 30B is not limited to the image forming apparatus. For example, the configuration of the base frame 30 or the base frame 30B may also be applied to a device in which a frame is configured by square pipes, such as a rack of a server device.

In the first exemplary embodiment, the cutout portion 320 is provided in the central portion of each of the square pipe 301 and the square pipe 302. However, a configuration may be made such that the cutout portions 320 are provided in both ends of each of the square pipe 301 and the square pipe 302 and the cutout portions 320 are not provided at other positions.

Further, in the second exemplary embodiment, the cutout portion 320B is provided in the central portion of each of the square pipe 301B and the square pipe 302B. However, a configuration may be made such that the cutout portions 320B are provided in both ends of each of the square pipe 301B and the square pipe 302B and the cutout portions 320B are not provided at other positions.

In the exemplary embodiments described above, the square pipe configuring the base frame 30 or the base frame 30B has a rectangular cross-section. However, the cross-sectional shape of the square pipe is not limited to a rectangle and polygonal shapes other than the rectangle are also acceptable.

In the first exemplary embodiment described above, the square pipes 301 and 302 have the cutout portions 320 at both end portions. However, there is no limitation to this configuration and a configuration is also acceptable in which the cutout portions 320 are provided at positions separated by a predetermined distance from both ends.

Further, in the second exemplary embodiment described above, the square pipes 301B and 302B have the cutout portions 320B at both end portions. However, there is no limitation to this configuration and a configuration is also acceptable in which the cutout portions 320B are provided at positions separated by a predetermined distance from both ends.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A frame comprising:
    a base frame that is formed of a framework formed in a substantially rectangular shape by square pipes and is provided with a plurality of cutout portions on the lower surface sides of the square pipes that are long sides of the framework;
    a bracket that includes a plate section on which a caster is mounted, and in which a portion of the plate section is fitted into the cutout portion, wherein the bracket includes at least one side surface section and marginal section present on short-side portions of the plate section, one long side portion also including a marginal section and a side surface section, and one other long side portion not including a side surface section and a marginal section, each side surface section having a respective marginal section bent away from a center of the bracket in a horizontal direction; and
    the caster that is mounted on the plate section and located further to the inside than an outer periphery of the framework when the base frame is viewed from the upper surface side.

2. The frame according to claim 1, wherein the cutout portions are present in both ends of each of the square pipes that become the long sides of the framework.

3. The frame according to claim 1, wherein a portion of the caster is located above the lower surface of the base frame.

4. The frame according to claim 2, wherein a portion of the caster is located above the lower surface of the base frame.

* * * * *